US010348358B1

(12) United States Patent
Ramakrishnan et al.

(10) Patent No.: US 10,348,358 B1
(45) Date of Patent: Jul. 9, 2019

(54) TRANSCEIVERS WITH DUAL POWER AMPLIFIERS FOR WIRELESS COMMUNICATIONS

(71) Applicant: Amazon Technologies, Inc., Seattle, WA (US)

(72) Inventors: Sameet Ramakrishnan, Saratoga, CA (US); Ravi Ichapurapu, Morgan Hill, CA (US); Milos Jorgovanovic, Mountain View, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/985,289

(22) Filed: May 21, 2018

(51) Int. Cl.
*H03F 3/19* (2006.01)
*H04B 1/04* (2006.01)
*H04B 1/58* (2006.01)

(52) U.S. Cl.
CPC ............... *H04B 1/581* (2013.01); *H03F 3/19* (2013.01); *H04B 1/0483* (2013.01); *H03F 2200/451* (2013.01); *H04B 2001/045* (2013.01)

(58) Field of Classification Search
CPC .................. H04B 1/581; H04B 1/0483; H04B 2001/045; H03F 3/19; H03F 2200/451
See application file for complete search history.

(56) References Cited

U.S. PATENT DOCUMENTS

| 7,925,227 | B2* | 4/2011 | Ichitsubo | H04B 1/44 |
| | | | | 455/114.1 |
| 2014/0097698 | A1* | 4/2014 | Wang | H04B 1/0458 |
| | | | | 307/104 |
| 2016/0262193 | A1* | 9/2016 | Hariharan | H04W 76/10 |
| 2017/0149956 | A1* | 5/2017 | Thorn | G06F 3/015 |
| 2017/0252256 | A1* | 9/2017 | Henshue | A61H 3/061 |
| 2017/0313262 | A1* | 11/2017 | Wisnia | B60R 11/04 |
| 2018/0241379 | A1* | 8/2018 | Murphy | H03K 5/15013 |

* cited by examiner

*Primary Examiner* — Nguyen T Vo
(74) *Attorney, Agent, or Firm* — Lee & Hayes, P.C.

(57) ABSTRACT

This disclosure describes techniques for implementing and utilizing a transceiver in a communication device that has two separate radio-frequency (RF) power amplifiers that are optimized to transmit signals using separate communication standards. The power amplifiers may be designed to convert a lower-power RF signal into different higher-power signals according to different standard-mandated, output-power limits. In this way, a communication device may arbitrate between two transceiver chains that include respective power adapters in order to convert lower-power RF signals into different higher-power RF signals. The higher-power RF signals may have different output-power levels that are appropriate for the respective communication standards of the separate transceiver chains.

17 Claims, 9 Drawing Sheets

TRANSCEIVERS WITH DUAL POWER AMPLIFIERS FOR WIRELESS COMMUNICATIONS

BACKGROUND

Computing devices continue to become more ubiquitous in today's society. As the capabilities and types of computing devices continue to increase and evolve, the desire for increased communications between devices has also increased. Advancements and developments in device communications illustrate the desire to increase the network connectivity between computing devices. However, in order for computing devices to communicate with different types of computing devices, these devices often must be able to communicate using a variety of wireless-communication standards and/or protocols. To enable devices to communicate using various wireless-communication standards and/or protocols, enhancements and improvements continue to emerge for communication components of computing devices, such as network interfaces, transceivers, etc. However, various difficulties still arise for computing devices that include components for communicating using various communication standards and/or protocols.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are illustrative and may not be to scale, and components within the figures may be depicted not to scale with each other.

DETAILED DESCRIPTION

Figure 1:
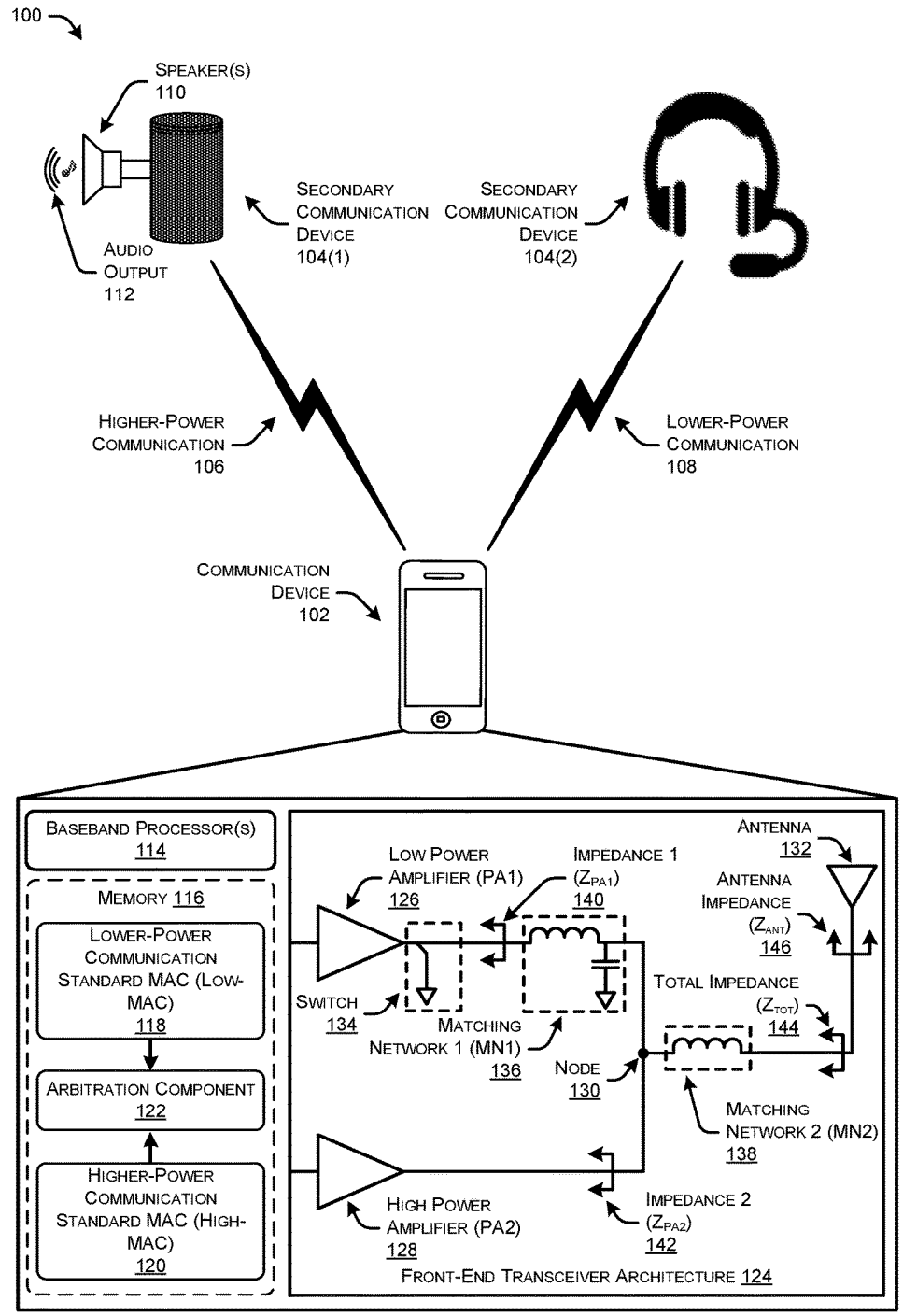
FIG. 1 illustrates a system-architecture diagram of an example environment in which a communication device includes and utilizes a front-end transceiver architecture that has separate power amplifiers optimized to transmit signals to secondary devices using different communication standards.

As the capabilities and types of computing devices continue to increase and evolve, the desire for increased communications between devices has also grown. To increase communications between computing devices, network interfaces, and/or transceivers included in these computing devices, these devices may be configured to communicate using a variety of communication standards and/or protocols. Enabling a computing device to communicate using a variety of communication standards may be advantageous for various reasons, such as enabling communications between different types of devices, enabling communications of different types of data, performing more power-efficient communications of data over different distances, etc. For example, it may be advantageous for a computing device, also referred to herein as "communication device," to select between various communication standards based on output-power requirements that are more appropriately tailored for the types of data being communicated, the distances over which the data is being communicated, etc.

This disclosure describes, at least in part, techniques for implementing and utilizing a transceiver in a communication device that has two separate radio-frequency (RF), power-amplifiers (PAs) that are optimized to communicate using separate communication standards. The communication device may include logic to determine by which communication standard the communication device would like to communicate, and select a transceiver chain with the appropriate PA to utilize for performing the communication.

To provide a specific example of the techniques described herein, a communication device may include a front-end transceiver architecture with two separate transceiver chains (also referred to herein as "transmit chains" or "transmission chains") that have respective power amplifiers that each convert a lower-power RF signal into a higher-power RF signal. The two power amplifiers may convert lower-power signals into higher-power signals at different power-levels depending on the communication standard by which the transceiver chains are designed to communicate. For instance, the front-end transceiver architecture may include a low-power transceiver chain, which includes a low power amplifier, that may be designed to transmit signals using a Bluetooth Low Energy (BLE) standard. The front-end transceiver architecture may further include a high-power transceiver chain, which includes a high power amplifier, that may be designed to transmit signals using a Bluetooth Classic (BT) standard. The BT standard may consume a higher amount of power than the BLE standard, and may further be capable of communicating larger amounts of data, and/or communicate data using a more complex protocol.

Traditionally, front-end transceiver architectures often include a single transceiver chain that is designed to support both BLE and BT standards. However, to do this a traditional front-end transceiver architecture may include a power amplifier that converts the low-power RF signals into a higher-power RF signal according to the BT standard mandated output-power limits. Thus, even if traditional front-end transceiver architectures are transmitting signals using the BLE standard, the signals transmitted according to the BLE standard may be converted to similar output-power levels as those mandated by the BT standard. Thus, traditional front-end transceiver architectures that utilize a single transceiver chain, and a single power amplifier, may suffer from inefficiencies with respect to power consumption when communicating using different communication standards.

The techniques described herein improve upon more traditional front-end transceiver architectures by utilizing separate transceiver chains that include respective power amplifiers that are designed to convert signals to appropriate power-levels for different communication standards. In addition to the use of separate power amplifiers designed to convert signals into appropriate output-power levels for different communication standards, the techniques described herein further include the use of logic to arbitrate between, or select between, the separate transceiver chains. Further, according to the techniques described herein, the front-end transceiver architecture may include additional hardware-based components that are controlled by the logic to activate, or otherwise "turn on," one of the transceiver chains to transmit signals, and deactivate, or otherwise "turn off," the other transceiver chain to avoid interfering with the signal transmissions being performed by the activated transceiver chain.

While some of the examples described herein are with respect to the BLE and BT standards, the techniques are equally applicable to any wireless communication standards which utilize lower power and higher power chains. As another example, the techniques are similarly applicable to the lower-power IEEE 802.11b standard (WiFi), and the higher-power IEEE 802.11g standard. This is simply another example, and the techniques described herein are equally applicable to any other wireless communication standard and/or protocol. The techniques described herein affect and improve upon communication techniques performed by communication devices. For example, by utilizing separate power amplifiers designed to convert signals to different output-power levels corresponding to different communication standards, the amount of power consumed by a transceiver and/or network interface may be reduced. More specifically, rather than utilizing a single transceiver chain, that may include an over-designed power amplifier that is specified for a higher-power communication standard, the techniques described herein select between a lower-power transceiver chain and a higher-power transceiver chain to ensure that signals are transmitted at appropriate output-power levels for the respective communication standards. Thus, the techniques described herein result in power-consumption efficiencies for network interfaces and/or transceivers which communicate signals using at least two communication standards.

As described herein, a transceiver chain may include various components for generating or otherwise configuring a signal to be transmitted according to a communication standard and/or protocol. Various types of transceiver chains are contemplated as being used according to the techniques described herein based on various factors, such as the type of communication standard. At a general level, the transceiver chain may include components such as an analog-to-digital converter, an oscillator, one or more filters (e.g., low pass filters, high pass filters, etc.), mixers, multiplexers, switches, power amplifiers (e.g., lower power amplifier and higher power amplifier described herein), and/or any other types of components usable to transmit a signal, such as a radio frequency (RF) signal. The components may include any type of components, such as electrical components, electro-mechanical components, mechanical components, etc. Although the description and Figures for this application target techniques involving power amplifiers in a transceiver chain (also referred to as a transmission chain or path), it should be understood that the transceiver chains described herein may further include any other type of component to modulate or otherwise generate/configure a signal for transmission via an antenna.

Certain implementations and embodiments of the disclosure will now be described more fully below with reference to the accompanying figures, in which various aspects are shown. However, the various aspects may be implemented in many different forms and should not be construed as limited to the implementations set forth herein. The disclosure encompasses variations of the embodiments, as described herein. Like numbers refer to like elements throughout. Although the figures and discussion illustrate certain operational steps of the system in a particular order, the steps described may be performed in a different order (as well as certain steps removed or added) without departing from the scope and/or intent of the disclosure.

FIG. 1 illustrates a system-architecture diagram of an example environment 100 in which a communication device 102 includes and utilizes a front-end transceiver architecture that has separate power amplifiers optimized to transmit signals to secondary devices 104 using different communication standards.

As shown in the environment 100, a communication device 102 may be communicating with multiple secondary communication devices 104(1) and 104(2) (collectively referred to herein as "secondary communication devices 104"). The communication device 102 and the secondary communication devices 104 may comprise any type of computing devices, including, but not limited to, mobile phones, tablets, speakers, headsets, laptop computers, wearable computing devices, display devices, routers, boosters, and/or any other type of device capable of communicating using wireless standards and/or protocols.

In the illustrative example, the communication device 102 is communicating with two secondary communication devices 104. However, the communication device 102 may be communicating with a single secondary communication device 104 in some examples, or more than two secondary communication devices 104 in other examples. The communication device 102 may be communicating with the secondary communication device 104(1) using a higher-power communication standard 106 for audio data, such as Bluetooth classic (e.g., A2DP), and communicating with the secondary communication device 104(2) using a lower-power communication standard 108, such as BLE. As illustrated, the secondary communication device 104(1) may include one nor more speakers 110 for audio output 112. In this scenario, the audio output 112 may comprise music audio data that is being transmitted by the communication device 102 to the secondary communication device 104(1) using a higher-power communication standard 106, such as Bluetooth Classic.

Depending on the types of communication standards by which the communication device 102 communicates, the communication device 102 may include a network interface and/or a transceiver that includes various components. For instance, the communication device 102 may include one or more baseband processors 114, such as a chip or a part of a chip, in the network interface that manages some or all of the radio functions (e.g., functions that require an antenna). In some examples, the baseband processor(s) 114 may include, or be associated with, software and/or firmware components. For instance, the communication device 102 may include firmware components stored in memory 116, such as a lower-power communication standard media access control ("low-MAC") component 118, a higher-power communication standard media access control ("high-MAC") component 120, and an arbitration component 122. Although components 118, 120, and 122 are described as being implemented in firmware, the components may also be implemented in software, in hardware, and/or in any combination of two or more of hardware, software, and/or firmware.

As shown in FIG. 1, the memory 116 is illustrated by a dotted line, which indicates that the components stored therein need not necessarily be stored in memory 116. For example, one or all of the Low-MAC 118, the High-MAC 12, and/or the arbitration component 122 may be hardware-based components, or at least partially implemented in hardware. Stated otherwise, the Low-MAC 118, the High-MAC 12, and/or the arbitration component 122 may each be software-based components, firmware-based components, hardware-based components, and/or any combination thereof in order to implement the functionality described herein.

The low-MAC component 118 may be configured to receive data packets that are to be transmitted using the lower-power communication standard 108 (e.g., BLE), and the high-MAC component 120 may be configured to receive data packets that are to be transmitted using the higher-power communication standard 106 (e.g., BT). Upon receiving one or more data packets that are to be transmitted using the lower-power communication standard 108, the low-MAC component 118 may provide an indication to the arbitration component 122 that the data packets are to be transmitted using the lower-power communication standard 108. Similarly, upon receiving one or more data packets that are to be transmitted using the higher-power communication standard 106, the high-MAC component 120 may provide an indication to the arbitration component 122 that the data packets are to be transmitted using the higher-power communication standard 106.

The arbitration component 122 may be configured to receive indications of the data packets that are requested to be transmitted by the low-MAC component 118 and the high-MAC component 120, and cause the communication device 102 to transmit signals at the appropriate standard 106/108 that represent the data packets.

The communication device 102 may include a front-end transceiver architecture 124 that includes two separate transceiver chains, or transmit chains. For example, the front-end transceiver architecture 124 may include a lower-power transceiver chain that includes a low power amplifier (PA1) 126, and may further include a higher-power transceiver chain that includes a high power amplifier (PA2) 128. As illustrated, the lower-power transceiver chain may be connected to the higher-power transceiver chain at a node 130. Further, the node 130 may electrically connect each of the transceiver chains to an antenna 132 such that signals that flow through the transceiver chains proceed to the antenna 132 for transmission.

The lower-power transceiver chain may be defined from the node 130 to the pin before PA1 126, and/or may further include additional components. Similarly, the higher-power transceiver chain may be defined from the node 130 to the pin before PA2 128, and/or may further include additional components. The arbitration component 122 may route data packets received by the low-MAC 118 as signals through the low power amplifier PA1 126, through the lower-power transceiver chain to the node 130, and ultimately to the antenna 132 for transmission. Similarly, the arbitration component 122 may route data packets received by the high-MAC 120 as signals through the high power amplifier PA2 128, through the lower-power transceiver chain to the node 130, and ultimately to the antenna 132 for transmission.

The arbitration component 122 may not only include logic, such as hardware-based logic and/or computer-readable instructions, to determine which transceiver chain to utilize for transmitting signals/data, but may further include logic for selectively activating and/or deactivating (e.g., turning on and turning off, enabling/disabling, etc.) PA1 126 and PA2 128. To accomplish this, the arbitration component 122 may interact with various hardware-based components, such as a switch 134, and also voltage supplies, to modify supply voltages for PA1 126 and/or PA2 128.

The switch 134 may comprise a shunt switch 134 that is able to be activated to move between different positions to open and close. The switch 134 may be connected between an output node of the PA1 126 and a ground (e.g., signal ground). Generally, the switch 134 may comprise any type of device that is designed or configurable to interrupt current flow between PA1 126 and the node 130. For example, the switch 134 may comprise an electrical switch, such as a bipolar transistor (e.g., bipolar junction transistor), a power diode, a Metal Oxide Semiconductor Field Effect Transistor (MOSFET), an Insulated Gate Bipolar Transistor (IGBT), a Silicon Controlled Rectifier (SCR), a Triac, a Diode AC (DIAC), a Gate Turn off Thyristor (GTO), or any other type of switch or relay. The switch 134 may, in some examples, comprise a mechanical switch, such as a Singe Pole Single Throw Switch (SPST), a Single Pole Double Throw Switch (SPDT), a Double Pole Single Throw Switch (DPST), a Double Pole Double Throw Switch (DPDT), a push button switch, a toggle switch, or any other type of mechanical switch.

The arbitration component 122 may be configured to control the switch 134, such as by a pin for the switch 134 and/or a voltage supply. For example, the arbitration component 122 may be electrically (and/or mechanically) coupled to the switch 134, such as by a wire, to drive a signal to control the signal as "high" or "low" to open and close the switch 134. The arbitration component 122 may open and close the switch depending on which power amplifier PA1 126 or PA2 128 is being utilized to transmit a signal. More specifically, the arbitration component 122 may include logic to determine that the low-MAC component 118 is requesting a data packet be transmitted in a signal. In such an example, the arbitration component 122 may determine to activate the PA1 126 to transmit a signal using the lower-power transceiver chain for the lower-power communication standard 108. For example, upon determining to utilize the PA1 126 of the lower-power transceiver chain, the arbitration component 122 may cause the switch 134 to open such that the output node of the PA1 126 is not connected to signal ground via the switch 134. Additionally, the arbitration component 122 may lower/reduce a supply voltage for the PA2 128 to a low voltage, such as 100 milli-volts, zero volts, etc. By opening the switch 134 and reducing the voltage supplied to the PA2 128, the arbitration component 122 effectively "turns off" PA2 128 and allows data/signals to flow through the PA1 126. Further, when PA2 128 is turned off or deactivated, the higher-power transceiver chain may be in a high-impedance mode such that signals/data that flow through the PA1 126 and towards the node 130 will refrain from flowing to the PA2 128, and will instead flow to the antenna 132.

Similarly, the arbitration component 122 may include logic to determine that the high-MAC component 120 is requesting a data packet be transmitted in a signal. In such an example, the arbitration component 122 may determine to activate the PA2 128 to transmit a signal using the higher-power transceiver chain for the higher-power communication standard 106. For example, upon determining to utilize the PA2 128 of the higher-power transceiver chain, the arbitration component 122 may cause the switch 134 to close such that the switch establishes a shunt to signal ground at the output node of the PA1 126. In this way, the switch 134 forms a shunt resonance which creates a high-impedance shunt path when the PA2 128 is powered on. The arbitration component 122 may apply an operating supply voltage for the PA2 128 to turn it on, and may lower/reduce a supply voltage for the PA1 126 to a low voltage, such as 100 milli-volts, zero volts, or any voltage that makes the impedance of the higher power receiver chain a high impedance relative to the low power transceiver chain that includes the PA1 126. By closing the switch 134 and reducing the voltage supplied to the PA1 126, the arbitration component 122 effectively "turns off" PA1 126 and allows data/signals to flow through the PA2 128. Further, when PA1 126 is turned off or deactivated, the lower-power transceiver chain may be in a high-impedance mode such that signals/data that flow through the PA2 128 and towards the node 130 will refrain from flowing to the PA1 126, and will instead flow to the antenna 132. In this way, the arbitration component 122 may selectively turn on PA1 126 and cause the higher-power transmit chain to move to a high-impedance mode, and may selectively turn on PA2 128 and cause the lower-power transmit chain to a high-impedance mode.

The front-end transceiver architecture 124 may further include various impedance components to modify impedances of the circuit as viewed from various nodes or wires. Generally, for transmitting signals, it is desirable to match antenna impedance with transmitter output impedance to maximize power and to avoid voltage reflection that distorts the signal. Thus, the front-end transceiver architecture 124 may include components to match impedances of the transmitter chains with the impedance of the antenna 132. Accordingly, the front-end transceiver architecture 124 may include matching-network 1 (MN1) 136 that is between the PA1 126 and the node 130, and may further include matching-network 2 (MN2) 138 that is placed between the node 130 and the antenna 132. In some examples, one or both of MN1 136 and/or MN2 138 may be placed on a chipset of the communication device 102, or off the chipset. MN1 136 is illustrated as including an inductor and a capacitor, but it may include various components, such as one or more inductors, one or more capacitors, one or more resistors, etc. Further, although MN1 136 is illustrated as including a series inductor and a shunt capacitor, in some examples, MN1 136 may include a series capacitor and a shunt inductor. Further, MN1 136 may include components that combine with an impedance 1 ($Z_{PA1}$) 140 associated with the PA1 126, and potentially also with an impedance of the switch 134, to match with an impedance of an impedance 2 ($Z_{PA2}$) 142 associated with PA2 128. Stated otherwise, the combined impedance of the lower-power transceiver chain when viewed from the node 130 (e.g., MN1 136, $Z_{PA1}$ 140, etc.) may match the $Z_{PA2}$ 142 of the higher-power transceiver chain when viewed from the node 130. MN1 136 may "match up" (e.g., increase) the impedance of $Z_{PA1}$ 140 to match the $Z_{PA2}$ 142. Thus, MN1 136 and MN2 138 may comprise any type of electrical component(s) that may be utilized for impedance matching. MN1 136 and/or MN2 138 may comprise any combination and/or arrangement of electrical components that may be utilized for impedance matching.

Further, the MN2 138 may include a capacitor to "match down" the impedances of the lower-power transceiver chain and the higher-power transceiver chain when viewed from the node 130 to result in a total impedances ($Z_{TOT}$) 144. Thus, along the lower-power transceiver chain, the $Z_{TOT}$ 144 may be a combination of the $Z_{PA1}$ 140, an impedance of the MN1 136, and an impedance of the MN2 138. Along the higher-power transceiver chain, the $Z_{TOT}$ 144 may be a combination of the $Z_{PA2}$ 142 with the impedance of the MN2 132. The $Z_{TOT}$ 144 may be substantially similar along the lower-power transceiver chain and the higher-power transceiver chain. Further, $Z_{TOT}$ 144 may be substantially the same as an antenna impedance ($Z_{ANT}$) 146 (e.g., 50 ohms). Thus, the impedances of each of the transceiver chains, with the addition of the MN1 136 and the MN2 138, may be substantially the same as the antenna impedance $Z_{ANT}$ 146 of the antenna 132 for impedance matching purposes.

In some examples, the MN1 136 and MN2 138 may be positioned in different locations depending on the impedances of the PA1 126, PA2 128, and/or other impedances associated with the higher-power transceiver chain and the lower-power transceiver chain. For example, the MN2 138 may be placed between the node 130 and the high-power amplifier 128. Additionally, the MN2 138 may be combined with MN1 136, or otherwise be placed between the node 130 and the PA1 126, such that the impedances of the higher-power transceiver chain and the lower-power transceiver chain, when viewed from the node 130, match that of the antenna impedance 146. Thus, the arrangement, and number of, matching networks may vary depending on the impedances of the PA1 126 and the PA2 128, as well as other components, in some examples.

In some examples, the front-end transceiver architecture 124 need not include any matching networks. For instance, the impedance of the higher-power transceiver chain and the lower-power transceiver chain may already match that of the antenna 132 such that matching networks are unnecessary to match up and/or match down impedances with the antenna impedance 146.

Figure 2:
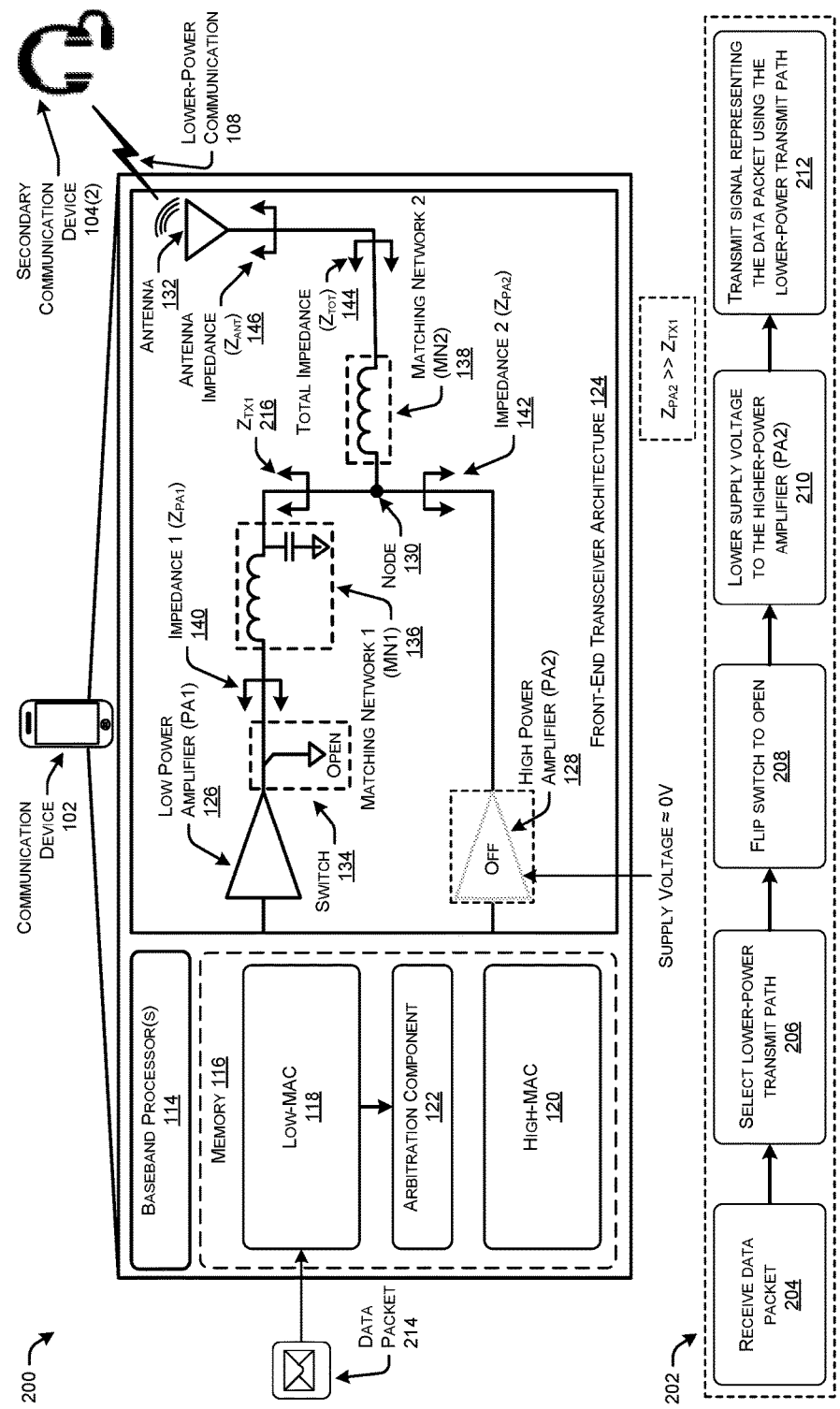
FIG. 2 illustrates a system-architecture diagram of an example environment in which a communication device includes a front-end transceiver architecture that has separate power amplifiers, and the communication device selects a lower power amplifier to transmit a signal to a secondary device.

FIG. 2 illustrates a system-architecture diagram of an example environment 200 in which a communication device 102 includes a front-end transceiver architecture 124 that has separate power amplifiers 126/128, and the communication devices selects a low power amplifier 126 to transmit a signal to a secondary communication device 104(2).

As illustrated in FIG. 2, a process 202 may be occurring where, at 204, the low-MAC component 118 may receive a data packet 214, or determine that a data packet 214, is to be transmitted using the lower-power communication standard 108. The low-MAC 118 may provide an indication to the arbitration component 122 that the data packet 214 needs to be transmitted using the lower-power communication 108. At 206, the arbitration component 122 may select the lower-power transmit chain that includes the PA1 126. The arbitration component 122 may determine to cause the data packet 214 to flow through the lower-power transceiver/transmit chain. At 208, the arbitration component 122 may flip the switch 134 to open, thereby opening the connection to signal ground so the signal does not flow to signal ground through the switch 134. At 210, the arbitration component 122 may lower the supply voltage to the higher-power amplifier PA2 128 to a low voltage, such as roughly 0 volts. By lowering the supply voltage, the arbitration component 122 may "turn off" or deactivate the PA2, thereby turning the higher-power transceiver chain into a high impedance chain that the signal representing the data packet 214 will not flow through. At 212, the communication device 102 may transmit the signal representing the data packet 214 using the low power transmit chain and via the antenna 132. Thus, the data packet 214 may be represented in a signal that is transmitted using the lower-power communication path 108. In this way, a PA1 that is designed or specified to output signals at an appropriate, standard-mandated output-power may be utilized to transmit the signal representing the data packet 214.

Figure 3:
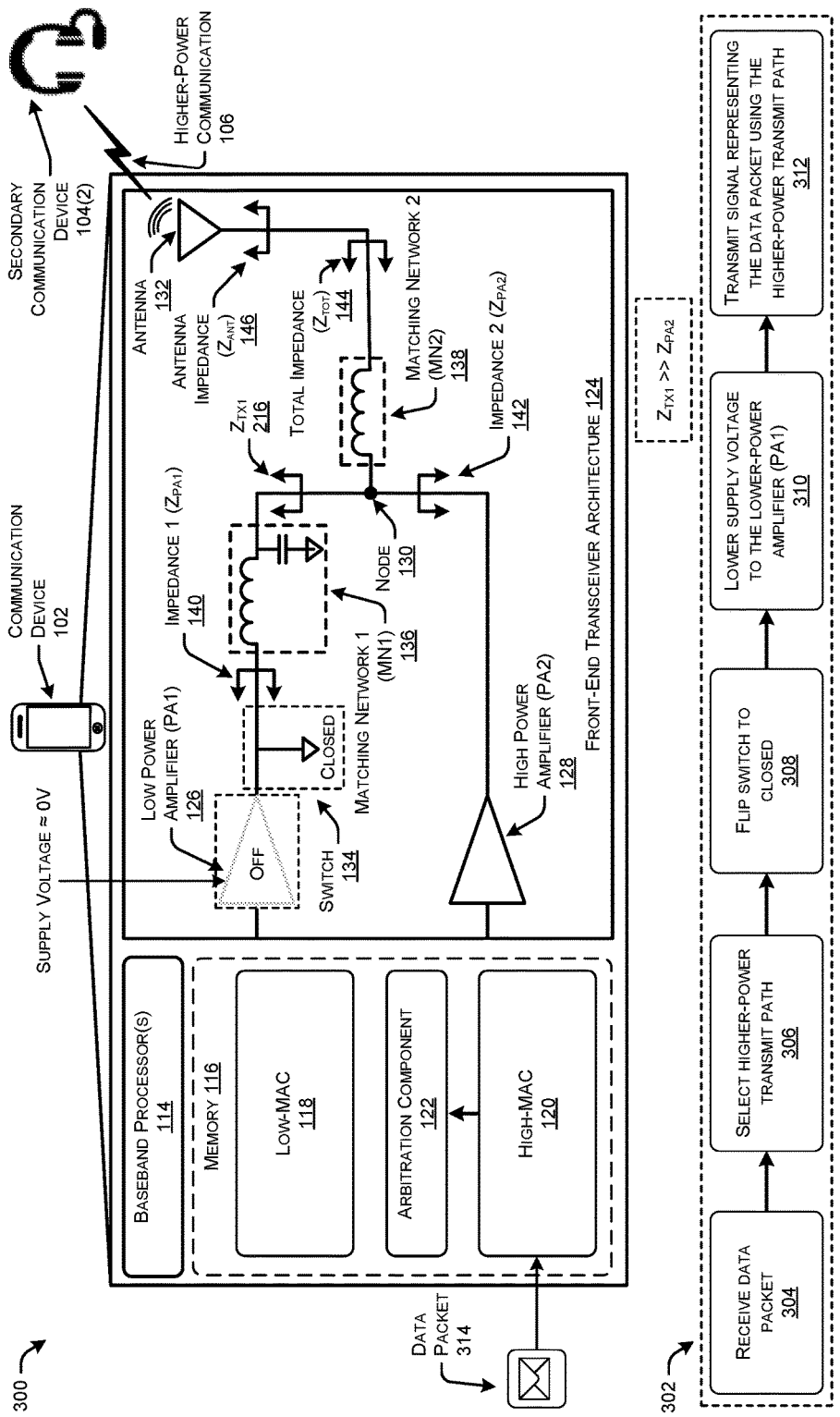
FIG. 3 illustrates a system-architecture diagram of an example environment in which a communication device includes a front-end transceiver architecture that has separate power amplifiers, and the communication device selects a higher power amplifier to transmit a signal to a secondary device.

FIG. 3 illustrates a system-architecture diagram of an example environment 300 in which a communication device 102 includes a front-end transceiver architecture 124 that has separate power amplifiers 126/128, and the communication device 102 selects a higher power amplifier 128 to transmit a signal to a secondary communication device 104(2).

As illustrated in FIG. 3, a process 302 is occurring where, at 304, the high-MAC component 120 may receive a data packet 314, or determine that a data packet 314, is to be transmitted using the higher-power communication standard 106. The high-MAC 120 may provide an indication to the arbitration component 122 that the data packet 314 needs to be transmitted using the higher-power communication standard 106. At 306, the arbitration component 122 may select the higher-power transmit chain that includes the PA2 128. The arbitration component 122 may determine to cause the data packet 314 to flow through the lower-power transceiver/transmit chain. At 308, the arbitration component 122 may flip the switch 134 to closed, thereby closing the connection to signal ground so the switch 134 forms a shunt resonance which creates a high-impedance shunt path when the PA2 128 is powered on. At 310, the arbitration component 122 may lower the supply voltage to the lower-power amplifier PA1 126 to a low voltage, such as roughly 0 volts. By lowering the supply voltage, the arbitration component 122 may "turn off" or deactivate the PA1, thereby turning the lower-power transceiver chain into a high impedance path that the signal representing the data packet 314 will not flow through. At 312, the communication device 102 may transmit the signal representing the data packet 314 using the high power transmit chain and via the antenna 132. Thus, the data packet 314 may be represented in a signal that is transmitted using the higher-power communication path 106. In this way, a PA2 128 that is designed or specified to output signals at an appropriate, standard-mandated output-power may be utilized to transmit the signal representing the data packet 314 for the higher-power communication standard 106.

In some examples, at 310, the supply voltage does not necessarily need to be lowered to a lower voltage (e.g., 100 milli-volts, 0 volts, etc.). For instance, because the switch 134 is flipped to closed to short circuit the lower-power transceiver chain, the supply voltage for PA1 126 may not need to be lowered at all because the switch 134 being closed to create the connection to ground may create a high-impedance chain relative to the higher-power transceiver chain. Thus, the supply voltage for PA1 126 may, or may not, be lowered to a lower voltage. It may be advantageous to lower the supply voltage for PA1 126 in order to preserve power, in some examples.

Figure 4:
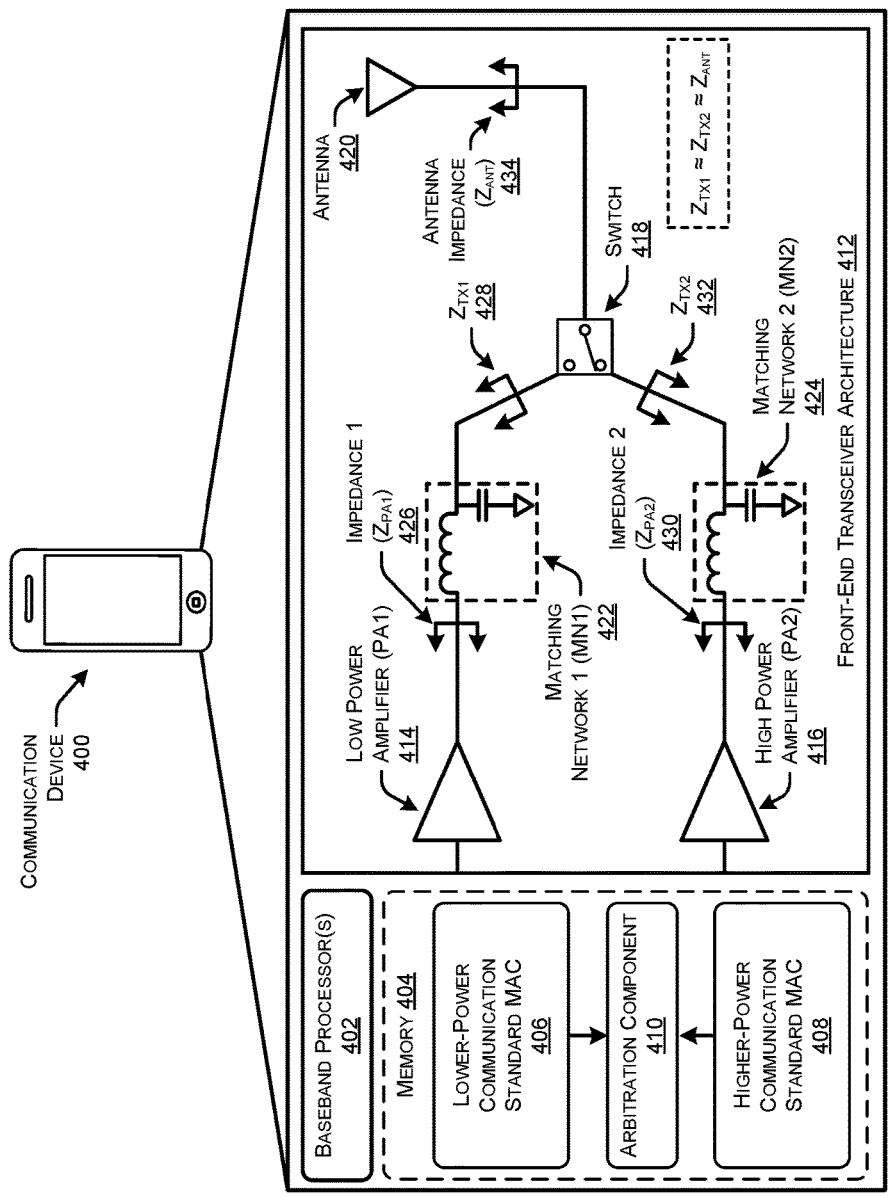
FIG. 4 illustrates a system-architecture diagram of another example environment in which a communication device includes and utilizes a front-end transceiver architecture that has separate power amplifiers optimized to transmit signals to secondary devices using different communication standards.

FIG. 4 illustrates a system-architecture diagram of another example environment in which a communication device 400 includes and utilizes a front-end transceiver architecture that has separate power amplifiers optimized to transmit signals to secondary devices using different communication standards.

The communication device 400 illustrates another example of a circuit that may be utilized to perform the techniques described herein. Similar to communication device 102, communication device 400 may include one or more baseband processors 402, and memory 404 storing a low-MAC component 406, a high-MAC component 408, and an arbitration component 410. The components 402, 406, and 408 may be configured to perform similar operations as those discussed above with respect to the communication device 102.

The communication device 400 may include a front-end transceiver architecture 412 that may include a lower-power transceiver chain that includes a low power amplifier (PA1) 414 and a matching-network 1 (MN1) 422. Further, the front-end transceiver architecture 412 may include a higher-power transceiver chain that includes a higher-power amplifier (PA2) 416 and a matching-network 2 (MN2) 424. The impedance 1 426, in combination with an impedance of the MN1 422, may comprise an impedance of $Z_{TX1}$ 428. Similarly, the impedance 2 430, in combination with an impedance of the MN2 424, may comprise an impedance of $Z_{TX2}$ 432.

The front-end transceiver architecture 412 may include a switch 418 disposed between an antenna 420. Although the switch 418 is illustrated as a single-pole double-throw switch or double-pole single-throw switch, the switch 418 may comprise any type of electrical/mechanical component usable as a switch. The arbitration component 410 may include logic to flip the switch 418 based on a type of communication for a data packet. For instance, the low-MAC 406 and the high-MAC 408 may indicate when a data packet needs to be transmitted in a signal. The arbitration component 410 may flip the switch 418 up (e.g., drive a signal to the switch as high or low) to complete a circuit to the lower-power transceiver chain to transmit signals according to a lower-power communication standard 108. Similarly, the arbitration component 410 may flip the switch 418 down to complete a circuit to the higher-power transceiver chain to transmit signals according to a higher-power communication standard 106. For impedance matching purposes, $Z_{XT1}$ 428 and $Z_{XT2}$ 432 may have impedances that are substantially similar to an antenna impedance ($Z_{ANT}$) 434 of the antenna 420.

Figure 5:
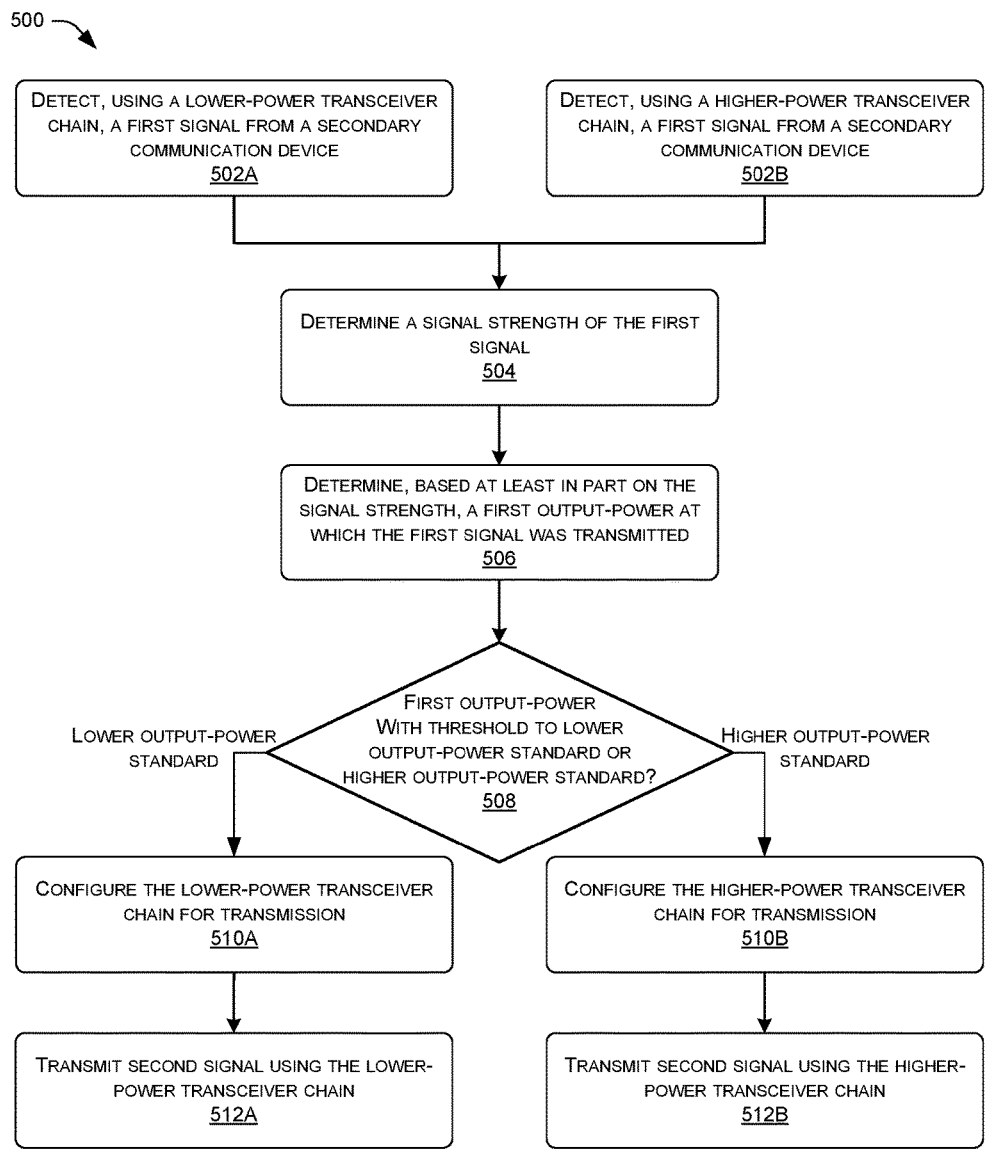
FIG. 5 illustrates a flow diagram of an example method for a front-end transceiver architecture to select a power amplifier to use based on a signal strength of a received signal.

FIG. 5 illustrates a flow diagram of an example method for a front-end transceiver architecture to select a power amplifier to use based on a signal strength of a received signal.

At 502A, the communication device 102 may detect, using a lower-power transceiver chain, a first signal from a secondary communication device. Alternatively, at 502B, the communication device 102 may detect, using a higher-power transceiver chain, a first signal from a secondary communication device.

At 504, the communication device may determine a signal strength of the first signal. In some examples, the communication device 504 may determine a signal strength based on a power at which the first signal was received. At 506, the communication device 102 may determine, based at least in part on the signal strength, a first output-power at which the first signal was transmitted 506. For instance, the communication device 102 may determine a protocol or standard at which the first signal was transmitted based on a format/structure of the signal, and/or the operations used when receiving the first signal. Further, the communication device 102 may store, for different communication protocols/standards, indications of how much power a signal transmitted using that standard/protocol loses as it travels over a distance. The communication device 102 may determine, based on the protocol used and the signal strength of the signal when received, how much power the signal lost when traveling. Thus, if the communication device 102 determines the signal strength of the received signal, and the amount of power the signal loses when traveling over distances for that protocol, the communication device 102 may determine an output-power at which the first signal was transmitted.

At 508, the communication device 102 may determine whether the first output-power at which the first signal was transmitted is within a threshold to a lower output-power standard (e.g., lower-power communication 108 from PA1 126), or a higher output-power standard (e.g., higher-power communication 106 from PA2 128). For instance, the communication device 102 may determine whether the first output-power corresponds to an output power for BLE, or an output power for BT. In this way, a signal strength of a received signal may be utilized to determine which communication standard was used to transmit the signal.

If the first output-power corresponds to the lower output-power standard (e.g., BLE), at 510A, the arbitration component 122 may configure the lower-power transceiver chain for transmission. For instance, the arbitration component 122 may perform one or more of opening the switch 134, providing a sufficient supply voltage to the PA1 126, lowering a supply voltage for the PA2 128 to a low voltage, such as zero, and so forth. Further, at 512A, the communication device 102 may transmit a second signal using the lower-power transceiver chain. For instance, the arbitration component 122 may cause a signal to flow out of the PA1 to the antenna 132, where the higher-power transceiver chain is a high impedance and does not substantially affect the signal.

Alternatively, if the first output-power corresponds to the higher-output-power standard (e.g., BT classic), at 510B, the arbitration component 122 may configure the higher-power transceiver chain for transmission of a second signal. For instance, the arbitration component 122 may perform one or more of flipping the switch 134 to a closed position to create a connection to signal ground, providing a sufficient supply voltage to the PA2 128, lowering a supply voltage for the PA1 126 to a low voltage, such as zero, and so forth. At 512B, the communication device 102 may transmit the second signal using the higher-power transceiver chain. For instance, the arbitration component 122 may cause a signal to flow out of the PA2 to the antenna 132, where the lower-power transceiver chain is a high impedance and does not substantially affect the second signal.

Figure 6:
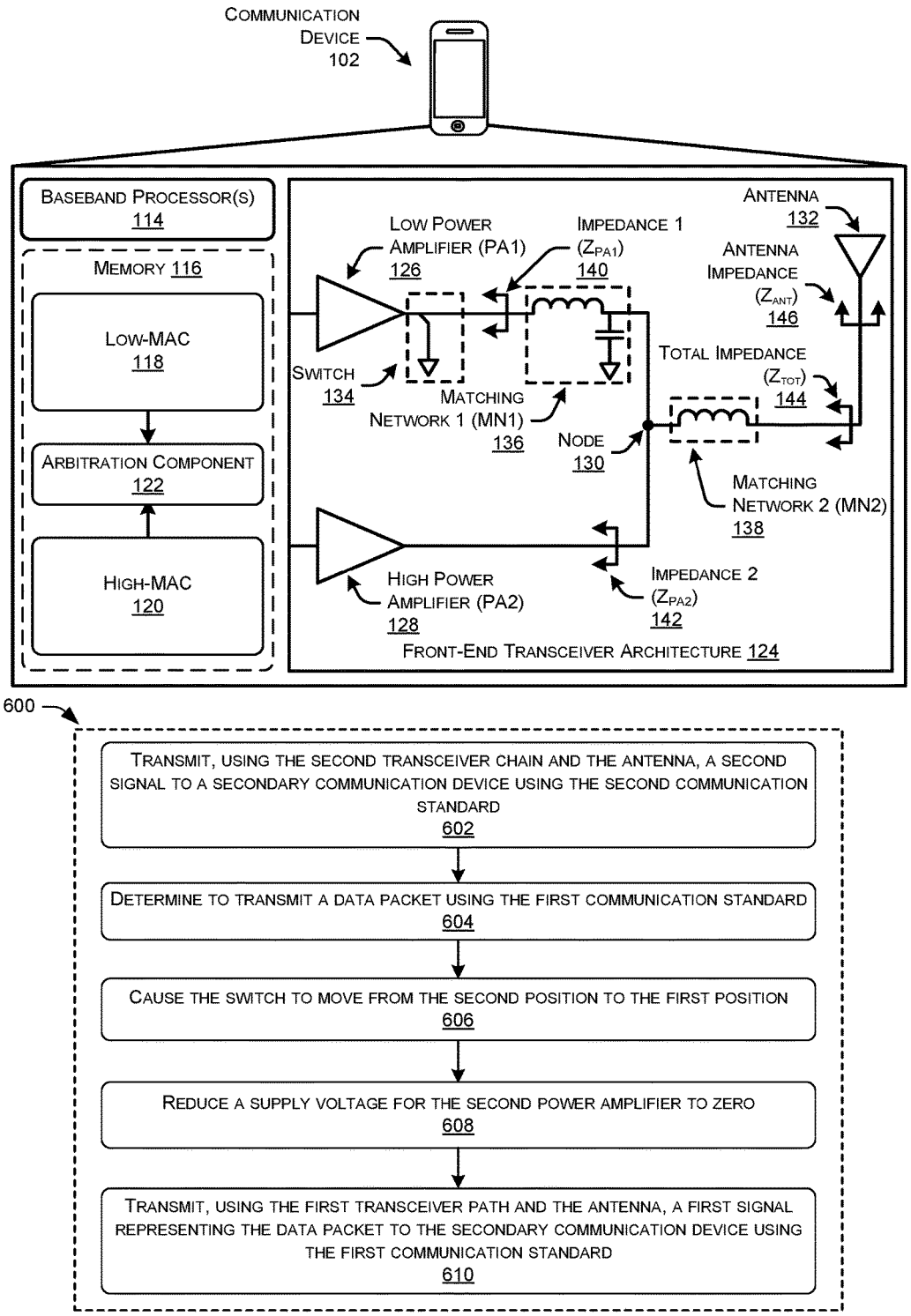
FIG. 6 illustrates a flow diagram of an example method for a communication device that includes a front-end transceiver architecture that has separate power amplifiers to select a low power amplifier to transmit a signal to a secondary device.
Figure 7:
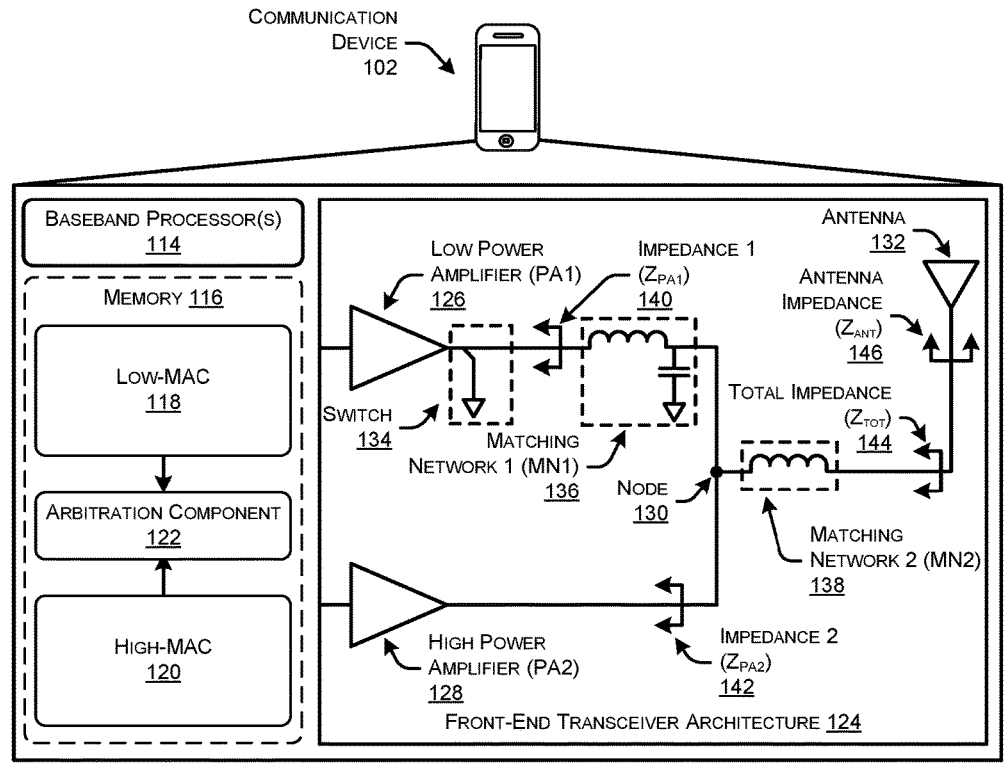
FIG. 7 illustrates another flow diagram of an example method for a communication device that includes a front-end transceiver architecture that has separate power amplifiers to select a low power amplifier to transmit a signal to a secondary device.
Figure 7:
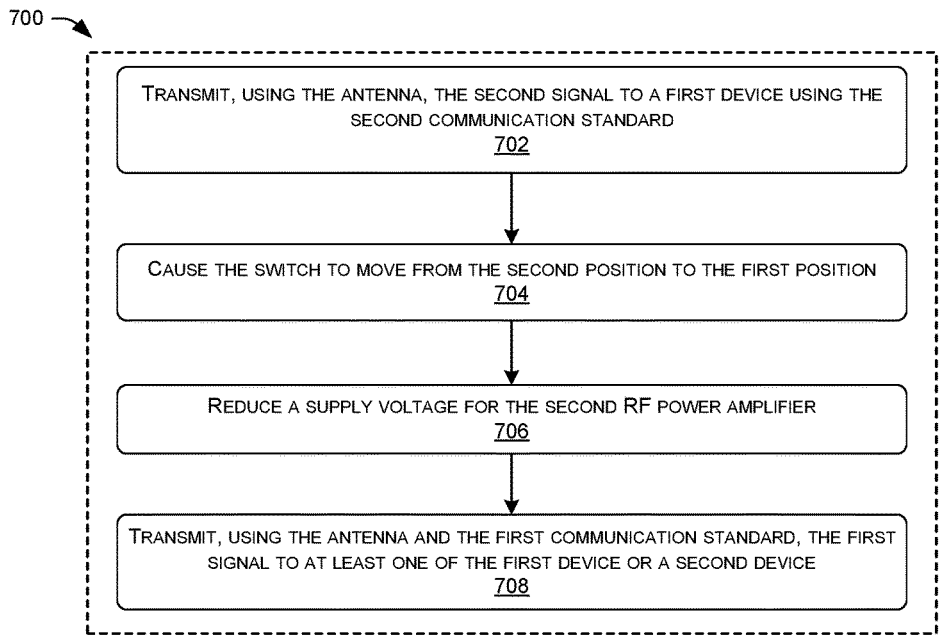
Figure 8:
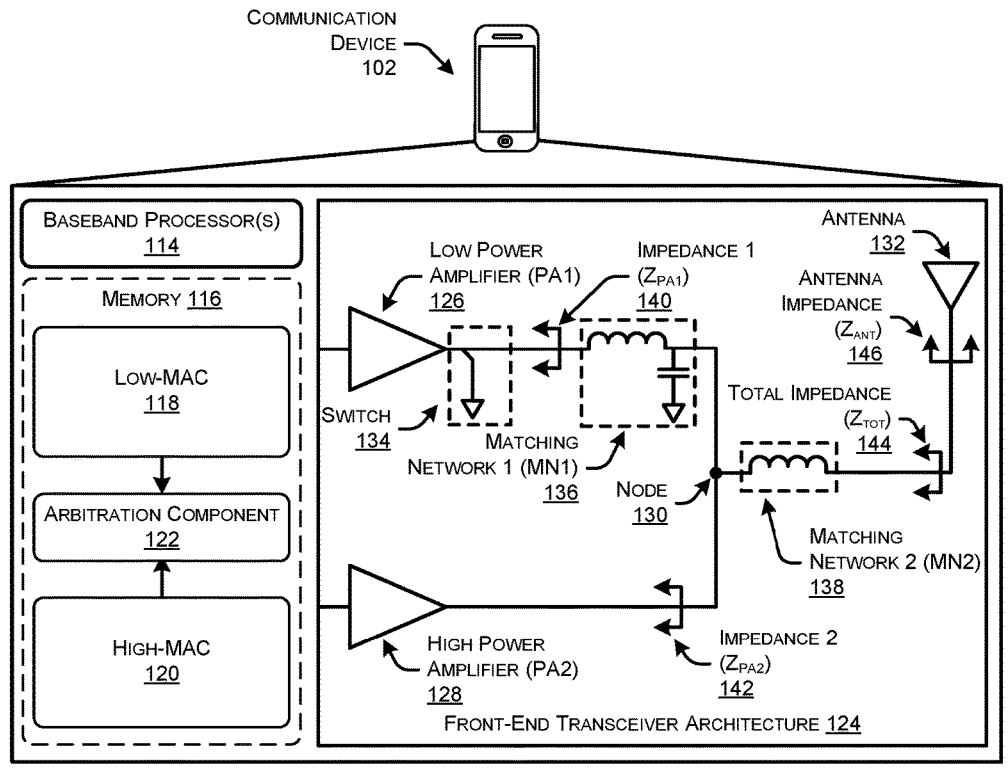
FIG. 8 illustrates a flow diagram of an example method for a communication device that includes a front-end transceiver architecture that has separate power amplifiers to select a higher power amplifier to transmit a signal to a secondary device.
Figure 8:
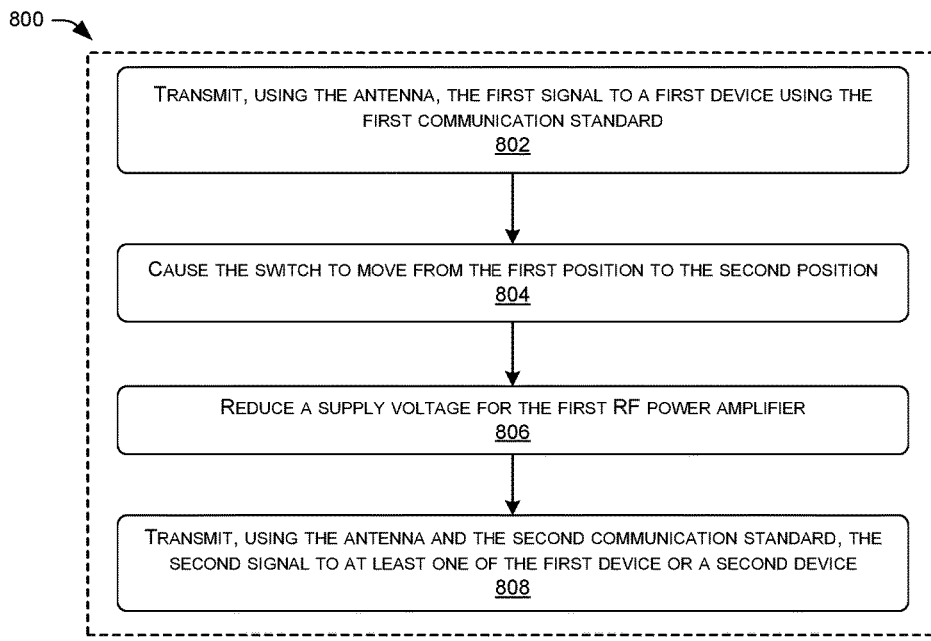

FIGS. 6-8 illustrate flow diagrams of example methods 600, 700, and 800 that illustrate aspects of the functions performed at least partly by the communication device 102 as described in FIGS. 1-5. The logical operations described herein with respect to FIGS. 6, 7, and 8 may be implemented (1) as a sequence of computer-implemented acts or program modules running on a computing system and/or (2) as interconnected machine logic circuits or circuit modules within the computing system.

The methods/processes 600, 700, and 800 may be implemented by various components (e.g., the Low-MAC 118, the High-MAC 12, and/or the arbitration component 122, etc.). The one or more components that perform the steps of methods/processes 600, 700, and 800 may each be implemented as software-based components, firmware-based components, hardware-based components, and/or any combination of at least two of hardware, software, and/or firmware in order to implement the functionality described herein.

The implementation of the various components described herein is a matter of choice dependent on the performance and other requirements of the computing system. Accordingly, the logical operations described herein are referred to variously as operations, structural devices, acts, or modules. These operations, structural devices, acts, and modules can be implemented in software, in firmware, in special purpose digital logic, and any combination thereof. It should also be appreciated that more or fewer operations might be performed than shown in the FIGS. 6-8 and described herein. These operations can also be performed in parallel, or in a different order than those described herein. Some or all of these operations can also be performed by components other than those specifically identified. Although the techniques described in this disclosure is with reference to specific components, in other examples, the techniques may be implemented by less components, more components, different components, or any configuration of components.

FIG. 6 illustrates a flow diagram of an example method 600 for a communication device that includes a front-end transceiver architecture that has separate power amplifiers to select a low power amplifier to transmit a signal to a secondary device.

In some examples, the method 600 may be performed at least partly by components of a communication device, such as the communication device 102. The communication device 102 may comprise an antenna 132 and a first transceiver chain including a first power amplifier 126 positioned to output first signals that pass through a first node 130 to the antenna 132. The first transceiver chain may configure the first signals to be transmitted by the antenna 132 using a first communication standard 108. The communication device 102 may further comprise a second transceiver chain including a second power amplifier 128 positioned to output second signals that pass through the first node 130 to the antenna 132. In such examples, the second transceiver chain may configure the second signals to be transmitted by the antenna 132 using a second communication standard 106, and the first signals are transmitted using the first communication standard at a first output-power that is lower than a second output-power at which the second signals are transmitted using the second communication standard. Further, the communication device 102 may comprise a switch 134 connected between a second node at an output of the first power amplifier 126 and ground (e.g., signal ground). The switch 134 may be selectively moveable between a first position to open a connection between the second node and the ground, and a second position to close the connection between the second node and the ground. The communication device 102 may include one or more processors 114 and one or more computer-readable media 114 storing computer-executable instructions that, when executed by the one or more processors, cause the one or more processors to perform operations comprising the steps of method 600.

At 602, the communication device may transmit, using the second transceiver chain and the antenna 132, a second signal to a secondary communication device 106 using the second communication standard (e.g., Bluetooth Classic standard, IEEE 802.11g standard, etc.). In such examples, the switch 134 may be in the second position while transmitting the second signals.

At 604, the arbitration component 122 may determine to transmit a data packet using the first communication standard.

For instance, the communication device 102 may detect a third signal received from the secondary communication device and using the second transceiver chain. The communication device 102 may further determine, based at least in part on a signal strength of the third signal, a third output-power at which the third signal was transmitted. Additionally, the communication device 102 may determine that the third output-power corresponds to the first output-power at which the first communication standard transmits the first signals. In such examples, determining to transmit the data packet using the first communication standard is based at least in part on the third output-power corresponding to the first output-power.

At 606, the arbitration component 122 may cause the switch 134 to move from the second position to the first position. For instance, the arbitration component 122 may change a voltage and/or current supplied to the switch 134

At 608, the arbitration component 122 may reduce a supply voltage for the second power amplifier to zero. At 610, the communication device 102 may transmit, using the first transceiver chain and the antenna, a first signal representing the data packet to the secondary communication device using the first communication standard.

In some examples, the communication device 102 may further comprise a first impedance-matching network (MN1 136) connected between the first node and the second node. The first impedance-matching network 136 may include at least one of a first inductor or a first capacitor. Further, a first combined impedance including the first impedance-matching network 136 and a first power-amplifier impedance 140 associated with the first power-amplifier 126 is substantially the same as a second power-amplifier impedance 142 associated with the second power amplifier 128. Additionally, a second impedance-matching network (MN2 138) may be connected between the first node 130 and the antenna 132. A second combined impedance 144 including the first combined impedance and the second impedance-matching network may be substantially the same as an antenna impedance 146 associated with the antenna 132.

FIG. 7 illustrates another flow diagram of an example method 700 for a system that includes a front-end transceiver architecture that has separate power amplifiers to select a low power amplifier to transmit a signal to a secondary device.

In some examples, the system may comprise one or more devices, or one or more chipsets within a device. In some examples, the system may comprise a communication device 102 and its components. In some examples, the method 700 may be performed at least partly by components of a communication device, such as the communication device 102. The communication device 102 may comprise an antenna 132 and a first transceiver chain including a first power amplifier 126 positioned to output first signals that pass through a first node 130 to the antenna 132. The first transceiver chain may configure the first signals to be transmitted by the antenna 132 using a first communication standard 108. The communication device 102 may further comprise a second transceiver chain including a second power amplifier 128 positioned to output second signals that pass through the first node 130 to the antenna 132. In such examples, the second transceiver chain may configure the second signals to be transmitted by the antenna 132 using a second communication standard 106, and the first signals are transmitted using the first communication standard at a first output-power that is lower than a second output-power at which the second signals are transmitted using the second communication standard. Further, the communication device 102 may comprise a switch 134 connected between a second node at an output of the first power amplifier 126 and ground (e.g., signal ground). The switch 134 may be selectively moveable between a first position to open a connection between the second node and the ground, and a second position to close the connection between the second node and the ground. The communication device 102 may include one or more processors 114 and one or more computer-readable media 114 storing computer-executable instructions that, when executed by the one or more processors, cause the one or more processors to perform operations comprising the steps of method 600.

At 702, the communication device 102 may transmit, using the antenna 132, the second signal to a first device 104(1) using the second communication standard 106. The switch 143 may be in the second position. At 704, the arbitration component 122 may cause the switch to move from the second position to the first position. At 706, the arbitration component 122 may reduce a supply voltage for the second RF power amplifier. At 708, the arbitration component 122 may transmit, using the antenna 132 and using the first communication standard 108, the first signal to at least one of the first device or a second device.

FIG. 8 a flow diagram of an example method 800 for a communication device 102 that includes a front-end transceiver architecture 124 that has separate power amplifiers to select a high power amplifier 128 to transmit a signal to a secondary device.

At 802, the communication device 102 may transmit, using the antenna 132, the first signal to a first device using the first communication standard. The switch 134 may be in the first position. At 804, the arbitration component 122 may cause the switch to move from the first position to the second position. At 806, the arbitration component 122 may reduce a supply voltage for the first RF power amplifier. At 808, the communication device 102 may transmit, using the antenna 132 and using the second communication standard, the second signal to at least one of the first device or a second device.

Figure 9:
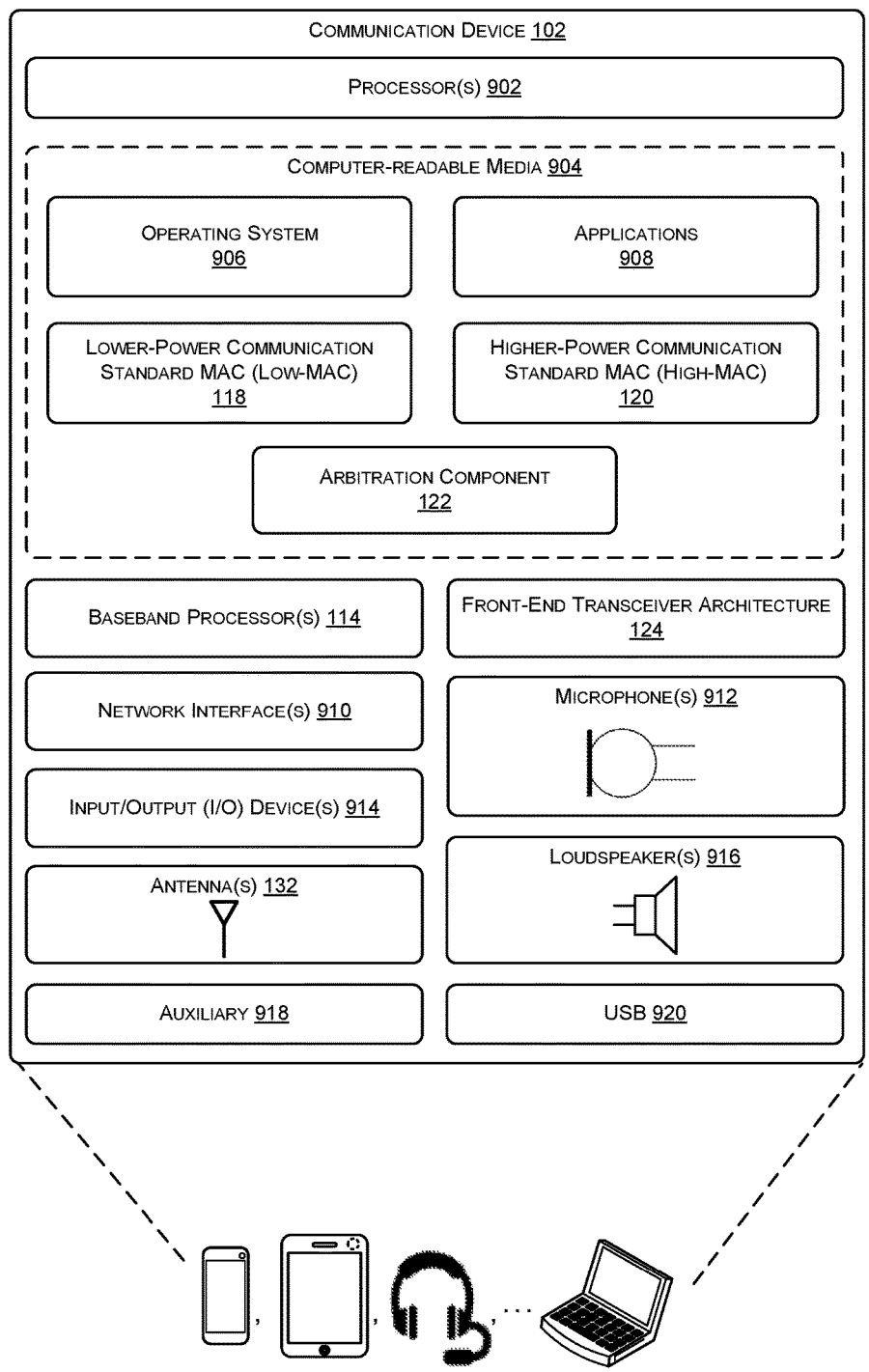
FIG. 9 illustrates a component diagram of an example communication device according to techniques described herein.

FIG. 9 illustrates a component diagram of an example communication device 102 according to techniques described herein. The communication device 102 may include one or more processors 902 and computer-readable media 904, which may include or correspond to memory 116 and/or 404. In some implementations, the processors(s) 902 may include a central processing unit (CPU), a graphics processing unit (GPU), both CPU and GPU, a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 902 may possess its own local memory, which also may store program modules, program data, and/or one or more operating systems.

The computer-readable media 904 (which may include memory 116 and/or 404) may include volatile and nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and which can be accessed by a computing device. The computer-readable media 704 may be implemented as computer-readable storage media ("CRSM"), which may be any available physical media accessible by the processor(s) 902 to execute instructions stored on the memory 904. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other tangible medium which can be used to store the desired information and which can be accessed by the processor(s) 902.

Several modules such as instruction, datastores, and so forth may be stored within the computer-readable media 904 and configured to execute on the processor(s) 902. A few example functional modules are shown as applications stored in the computer-readable media 904 and executed on the processor(s) 902, although the same functionality may alternatively be implemented in hardware, firmware, or as a system on a chip (SOC).

An operating system 906 may be configured to manage hardware and services within and coupled to the communication device 102 for the benefit of other modules. The communication device 102 may also include a plurality of applications 908 stored in the computer-readable media 904 or otherwise accessible to the communication device 102.

Generally, the communication device 102 has input devices 914 and output devices 914. The input devices 914 may include a keyboard, keypad, mouse, touch screen, joystick, control buttons, etc. In some implementations, one or more microphones 912 may function as input devices 914 to receive audio input, such as user voice input. The output devices 914 may include a display, a light element (e.g., LED), a vibrator to create haptic sensations, or the like. In some implementations, one or more speakers 916 may function as output devices 914 to output audio sounds.

The communication device 102 may further include a front-end transceiver 124 coupled to an antenna 132 to facilitate a wireless connection to a network. The front-end transceiver 124 may implement one or more of various wireless technologies, such as Wi-Fi, Bluetooth, RF, and so on. A USB port 920 may further be provided as part of the communication device 102 to facilitate a wired connection to a network, or a plug-in network device that communicates with other wireless networks. In addition to the USB port 920, or as an alternative thereto, other forms of wired connections may be employed, such as a broadband connection.

The communication device 102 may include one or more network interfaces 910 to communicate over wired and/or wireless networks. The network interface(s) 910 may include the baseband processor(s) 114 and/or the front-end transceiver architecture 124. The network interface(s) 910 may generally include all components and logic for performing communications that have not been discussed herein with respect to FIGS. 1-8. For instance, the network interface(s) 910 may include wired or wireless interfaces, such as a wireless or Wi-Fi network communications interface, an Ethernet communications interface, a cellular network communications interface, a Bluetooth communications interface, etc., for communications with the devices over various types of networks, including wide-area network, local-area networks, private networks, public networks etc. In the case of a wireless communications interfaces, such interfaces may include radio transceivers and associated control circuits and logic for implementing appropriate communication protocols. The network interface(s) 910 may include logic for communicating using any different type of network communication protocol.

While the foregoing invention is described with respect to the specific examples, it is to be understood that the scope of the invention is not limited to these specific examples. Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims of the application.

What is claimed is:

1. A communication device comprising:
   an antenna;
   a first transceiver chain including a first power amplifier to output a first signal, the first transceiver chain configuring the first signal to be transmitted by the antenna according to a first protocol;
   a second transceiver chain including a second power amplifier to output a second signal, the second transceiver chain configuring the second signal to be transmitted by the antenna according to a second protocol,
   wherein the first signal is transmitted at a first output-power that is lower than a second output-power at which the second signal is transmitted;
   a switch connected between the first power amplifier and a ground; and
   one or more components comprising logic to perform operations comprising:
      coupling, using the switch, the first power amplifier to the ground;
      transmitting, using the second transceiver chain, the second signal to a first device;
      receiving a third signal from a second device;
      determining, based at least in part on a signal strength of the third signal, a third output-power associated with the third signal;
      determining that the third output-power is within a threshold value of the first output-power;
      decoupling, using the switch, the first power amplifier from the ground;
      reducing a supply voltage for the second power amplifier to substantially zero volts; and
      transmitting, using the first transceiver chain, the first signal to the second device using the first protocol.

2. The communication device of claim 1, wherein the first signal and the second signal each pass through a node to the antenna to be transmitted, the communication device further comprising:
   a first impedance-matching network connected between the switch and the node, wherein:
      the first impedance-matching network includes at least one of a first inductor or a first capacitor; and
      a first combined impedance including the first impedance-matching network and a first power-amplifier impedance associated with the first power-amplifier is substantially the same as a second power-amplifier impedance associated with the second power amplifier; and
   a second impedance-matching network connected between the node and the antenna, wherein a second combined impedance including the first combined impedance and the second impedance-matching network is substantially the same as an antenna impedance associated with the antenna.

3. A device comprising:
   an antenna;
   a first radio-frequency (RF) power amplifier to output a first signal, the first signal being transmitted using the antenna at a first output-power and according to a first protocol;
   a second RF power amplifier to output a second signal, the second signal being transmitted using the antenna at a second output-power and according to a second protocol,
   wherein the first output-power is lower than the second output-power;
   a switch connected between the first RF power amplifier and a ground; and
   one or more components comprising logic to perform operations comprising:
      coupling, using the switch, the first RF power amplifier to the ground;
      transmitting the second signal to a first device;
      determining a signal strength for a third signal received from at least one of the first device or a second device;
      determining a third output-power associated with the third signal;
      determining that the third output-power is within a threshold value of the first output-power;
      decoupling, using the switch, the first RF power amplifier from the ground;
      transmitting the first signal to the first device or the second device.

4. The device of claim 3, wherein the first signal and the second signal each pass through a node to the antenna, further comprising:
   an impedance-matching network connected between the switch and the node,
   wherein a combined impedance that includes a first impedance of the impedance-matching network and a second impedance of the first RF power amplifier is substantially the same as a third impedance of the second RF power amplifier.

5. The device of claim 4, wherein:
   the impedance-matching network comprises a first impedance-matching network;
   the combined impedance comprises a first combined impedance; and
   the device further comprising:
      a second impedance-matching network connected between the node and the antenna such that, when the first RF power amplifier is decoupled from ground, a second combined impedance that includes the first combined impedance and the second impedance-matching network is substantially the same as a fourth impedance associated with the antenna.

6. The device of claim 4, wherein:
   the impedance-matching network comprises a first impedance-matching network;
   the combined impedance comprises a first combined impedance; and
   the device further comprising:
      a second impedance-matching network connected between the node and the antenna such that, when the first RF power amplifier is coupled to ground, a second combined impedance that includes the third impedance of the second RF power amplifier and the second impedance-matching network is substantially the same as a fourth impedance associated with the antenna.

7. The device of claim 3, the operations further comprising:
   receiving, at the one or more components, a data packet;
   determining that the data packet is to be transmitted according to the first protocol; and
   generating the first signal such that the first signal represents the data packet.

8. The device of claim 3, wherein the supply voltage comprises a first supply voltage, the operations further comprising:
   reducing a second supply voltage for the first RF power amplifier to substantially zero volts while the second signal is transmitted to the first device,
   wherein reducing the supply voltage for the second RF power amplifier comprises reducing the first supply voltage to substantially zero volts.

9. The device system of claim 3, wherein
   the first protocol comprises a Bluetooth Low Energy protocol and the second protocol comprises a Bluetooth Classic protocol.

10. A communications device comprising:
   an antenna;
   a first radio-frequency (RF) power amplifier to output a first signal, the first signal being transmitted using the antenna at a first output-power and according to a first protocol;
   a second radio-frequency (RF) power amplifier positioned to output a second signal, the second signal being transmitted using the antenna at a second output-power and according to a second protocol,
   wherein the first output-power is lower than the second output-power;
   a switch connected between the first RF power amplifier and a ground; and
   one or more components comprising logic to perform operations comprising:
      decoupling, using the switch, the first RF power amplifier from the ground;
      transmitting the first signal to a first device;
      determining a signal strength for a third signal received from the at least one of the first device or a second device;
      determining a third output-power associated with the third signal;
      determining that the third output-power is within a threshold value of the second output-power;

coupling, using the switch, the first RF power amplifier to the ground; and transmitting, using the antenna and using the second protocol, the second signal to the first device or the second device.

11. The communication device of claim 10, wherein the first signal and the second signal each pass through a node to the antenna, further comprising:

an impedance-matching network connected between the first RF power amplifier and the node, wherein a combined impedance that includes a first impedance of the impedance-matching network and a second impedance of the first RF power amplifier is substantially the same as a third impedance of the second RF power amplifier.

12. The communication device of claim 11, wherein:

the impedance-matching network comprises a first impedance-matching network;

the combined impedance comprises a first combined impedance; and the communication device further comprising:

a second impedance-matching network connected between the node and the antenna such that, when the first RF power amplifier is decoupled from the ground, a second combined impedance that includes the first combined impedance and the second impedance-matching network is substantially the same as a fourth impedance associated with the antenna.

13. The communication device of claim 11, wherein:

the impedance-matching network comprises a first impedance-matching network;

the combined impedance comprises a first combined impedance; and the communication device further comprising:

a second impedance-matching network connected between the node and the antenna such that, when the first RF power amplifier is coupled to the ground, a second combined impedance that includes the third impedance of the second RF power amplifier and the second impedance-matching network is substantially the same as a fourth impedance associated with the antenna.

14. The communication device of claim 10, the operations further comprising:

receiving, at the one or more components, a data packet;

determining that the data packet is to be transmitted according to the second protocol; and generating the second signal such that the second signal represents the data packet.

15. The communication device of claim 10, the operations further comprising, prior to transmitting the second signal, reducing a supply voltage for the first RF power amplifier.

16. The communication device of claim 10, the operations further comprising:

determining to transmit a third signal using the first protocol;

decoupling, using the switch, the first RF power amplifier from the ground;

reducing a supply voltage for the second RF power amplifier; and transmitting, using the first protocol, the third signal.

17. The communication device of claim 10, wherein the first protocol comprises a Bluetooth Low Energy protocol and the second protocol comprises a Bluetooth Classic protocol.

* * * * *

UNITED STATES PATENT AND TRADEMARK OFFICE
CERTIFICATE OF CORRECTION

PATENT NO. : 10,348,358 B1
APPLICATION NO. : 15/985289
DATED : July 9, 2019
INVENTOR(S) : Sameet Ramakrishnan et al.

It is certified that error appears in the above-identified patent and that said Letters Patent is hereby corrected as shown below:

In the Claims

Column 17, after Line 50 and before Line 51, add -- reducing a supply voltage for the second RF power amplifier; and --.

Signed and Sealed this
Sixth Day of August, 2019

Andrei Iancu
*Director of the United States Patent and Trademark Office*